US012750008B2

(12) United States Patent

Yang et al.

(10) Patent No.: US 12,750,008 B2
(45) Date of Patent: Sep. 29, 2026

(54) AMPLIFIER WITH SOURCE DEGENERATION

(71) Applicant: MACRONIX INTERNATIONAL CO., LTD., Hsinchu (TW)

(72) Inventors: Shang-Chi Yang, Changhua (TW); Tung-Yu Li, Taoyuan (TW); Jian-Syu Lin, Chiayi (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 491 days.

(21) Appl. No.: 18/371,217

(22) Filed: Sep. 21, 2023

(65) Prior Publication Data

US 2025/0105789 A1 Mar. 27, 2025

(51) Int. Cl.
*H03F 3/45* (2006.01)
*H03F 1/02* (2006.01)

(52) U.S. Cl.
CPC ........... *H03F 1/02* (2013.01); *H03F 3/45179* (2013.01); *H03F 2200/498* (2013.01)

(58) Field of Classification Search
CPC .. H03F 1/02; H03F 3/45179; H03F 2200/498; H03F 2203/45494; H03F 3/4565; H03F 3/45183; H03F 3/45192; H03F 3/45089
USPC ........................................................... 330/253
See application file for complete search history.

(56) References Cited

U.S. PATENT DOCUMENTS

| | | | | |
|---|---|---|---|---|
| 10,267,896 | B1 | 4/2019 | Rodenbeck et al. | |
| 2010/0264896 | A1* | 10/2010 | Tonomura | G05F 1/569 361/18 |
| 2022/0065901 | A1* | 3/2022 | Desai | H03F 3/45748 |
| 2023/0353100 | A1* | 11/2023 | Varier | H03F 3/45192 |
| 2023/0402980 | A1* | 12/2023 | Cosentino | H03F 3/45179 |

OTHER PUBLICATIONS

Arnaud, et al., "Bulk Linearization Techniques," 2019 IEEE International Symposium on Circuits and Systems (ISCAS), Sapporo, Japan, May 26-29, 2019, pp. 1-5.

(Continued)

*Primary Examiner* — Khanh V Nguyen
(74) *Attorney, Agent, or Firm* — Korbin S Van Dyke; Haynes Beffel & Wolfeld LLP

(57) ABSTRACT

A differential amplifier includes an input pair of transistors with a source-side resistor circuit, having a transistor biased in a triode region, and a current source. The resistor circuit in combination with a capacitance, causes source degeneration in the amplifier. The source side resistor circuit includes a first MOS transistor having a first channel terminal connected to the source of a first transistor in the differential pair, and a second channel terminal connected to the bulk terminal, and a second MOS transistor having a first channel terminal connected to the source of a second transistor in the differential pair, and a second channel terminal connected to the bulk terminal. A bias circuit biases the first MOS transistor and the second MOS transistor in a triode region. The resistance of the source-side resistor circuit and the gain of the transistors in the differential amplifier can track across process corners.

20 Claims, 6 Drawing Sheets

(56) References Cited

OTHER PUBLICATIONS

Nguyen et al., "3.6 mW Active-Electrode ECG_ETI Sensor System Using Wideband Low-Noise Instrumentation Amplifier and High Impedance Balanced Current Driver," Sensors, 23(5), Feb. 24, 2023, 23 pages.

Veeravalli, et al., "Transconductance amplifier structures with very small transconductances: a comparative design approach," in IEEE Journal of Solid-State Circuits, vol. 37, No. 6, Jun. 2002, pp. 770-775.

* cited by examiner

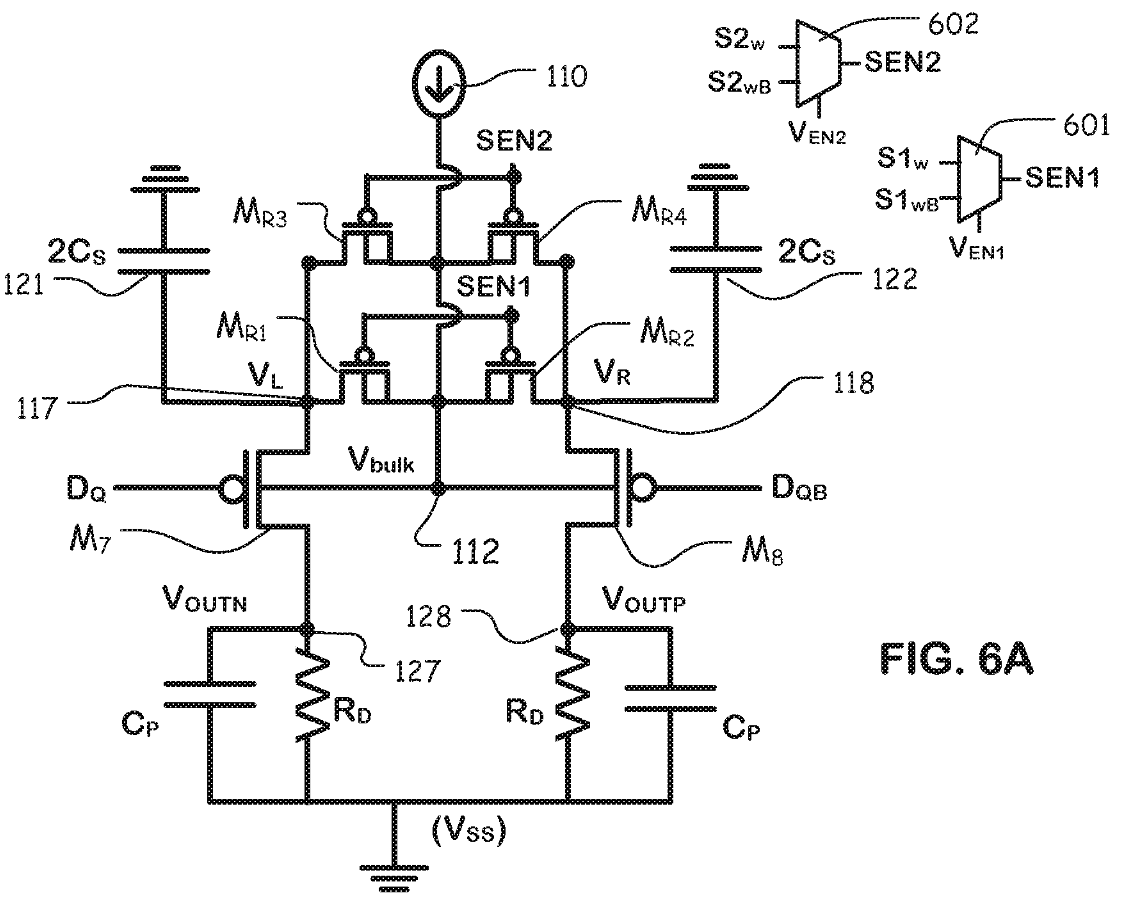
FIG. 6A
FIG. 6B
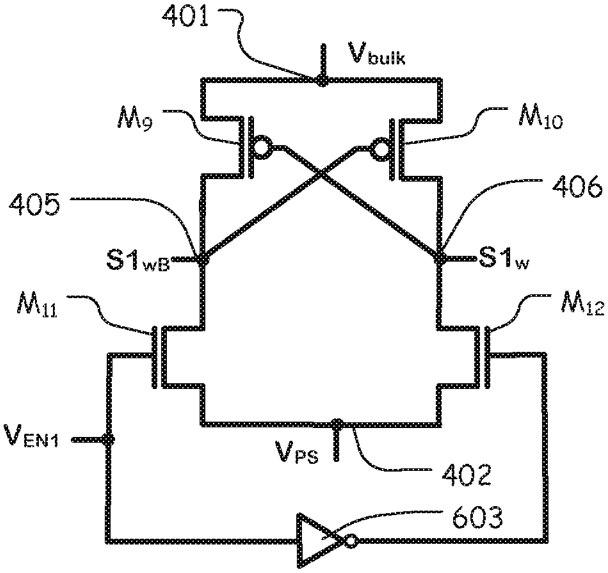
FIG. 6C
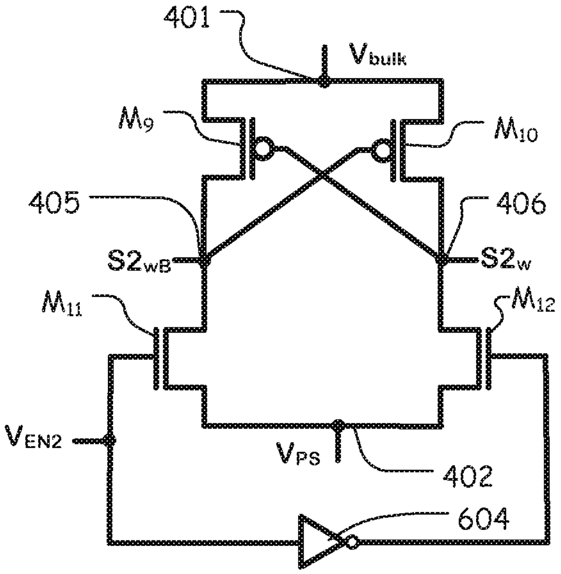

AMPLIFIER WITH SOURCE DEGENERATION

BACKGROUND

Field

A technology described herein relates to differential amplifiers, and to equalizer circuits utilizing differential amplifiers.

Description of Related Art

Input signals for integrated circuits can have very high frequencies, on the order of gigahertz in some cases. Communication channels which deliver the input signals can suffer channel loss, particularly at high frequencies. Accordingly, receivers in these environments often include high-speed input buffers having equalizer circuits to compensate for channel loss, and to provide for uniform gain across wide input frequencies. One type of equalizer has been referred to as a continuous time linear equalizer CLTE, which can be based on a differential amplifier with source degeneration. Source degeneration can be tuned to improve the AC gain at the operating frequencies for the equalizers, including at frequencies on the order of gigahertz.

In integrated circuit manufacturing, so-called process corner variations can impact the operating characteristics of circuits on the chips. Thus, a problem encountered in the manufacturing of equalizer circuits used in the receivers on integrated circuits, and other differential amplifier base circuits, relates to maintaining operating characteristics across process corners.

It is desirable to provide improved circuit structures that can be more stable across process corners for high-frequency equalizers and differential amplifiers.

SUMMARY

An amplifier including an input pair of transistors with a source-side resistor circuit is described. The source-side resistor circuit includes a transistor biased in a triode region. The source-side resistor circuit in combination with a capacitance, causes source degeneration in the amplifier with an improved gain at a target frequency. The resistance of the source-side resistor circuit and the gain of the transistors in the differential amplifier can track across process corners.

An amplifier circuit is described comprising an input pair of transistors, the transistors in the pair having respective source, drain, gate and bulk terminals. A source side resistor circuit is connected to the sources of the transistors in the input pair. The source side resistor circuit includes a first MOS transistor having a first channel terminal connected to the source of a first transistor in the differential pair, and a second channel terminal connected to the bulk terminal, and a second MOS transistor having a first channel terminal connected to the source of a second transistor in the differential pair, and a second channel terminal connected to the bulk terminal. A bias circuit to bias the first MOS transistor and the second MOS transistor in a triode region is described.

An equalizer circuit is described with good uniformity in compensation across a target frequency range, using an input pair with a source-side resistor circuit which includes a transistor biased in a triode region.

An input buffer for a high speed data channel is described using an equalizer circuit like that described herein.

Other aspects and advantages of the present technology can be seen on review of the drawings, the detailed description and the claims, which follow.

BRIEF DESCRIPTION OF THE DRAWINGS

FIGS. 6A, 6B and 6C provide a circuit diagram for an example of a differential amplifier having a source-side resistor circuit with two pairs of transistors with corresponding bias circuits.

DETAILED DESCRIPTION

A detailed description of embodiments of the present invention is provided with reference to the FIGS. 1-7.

Figure 1:
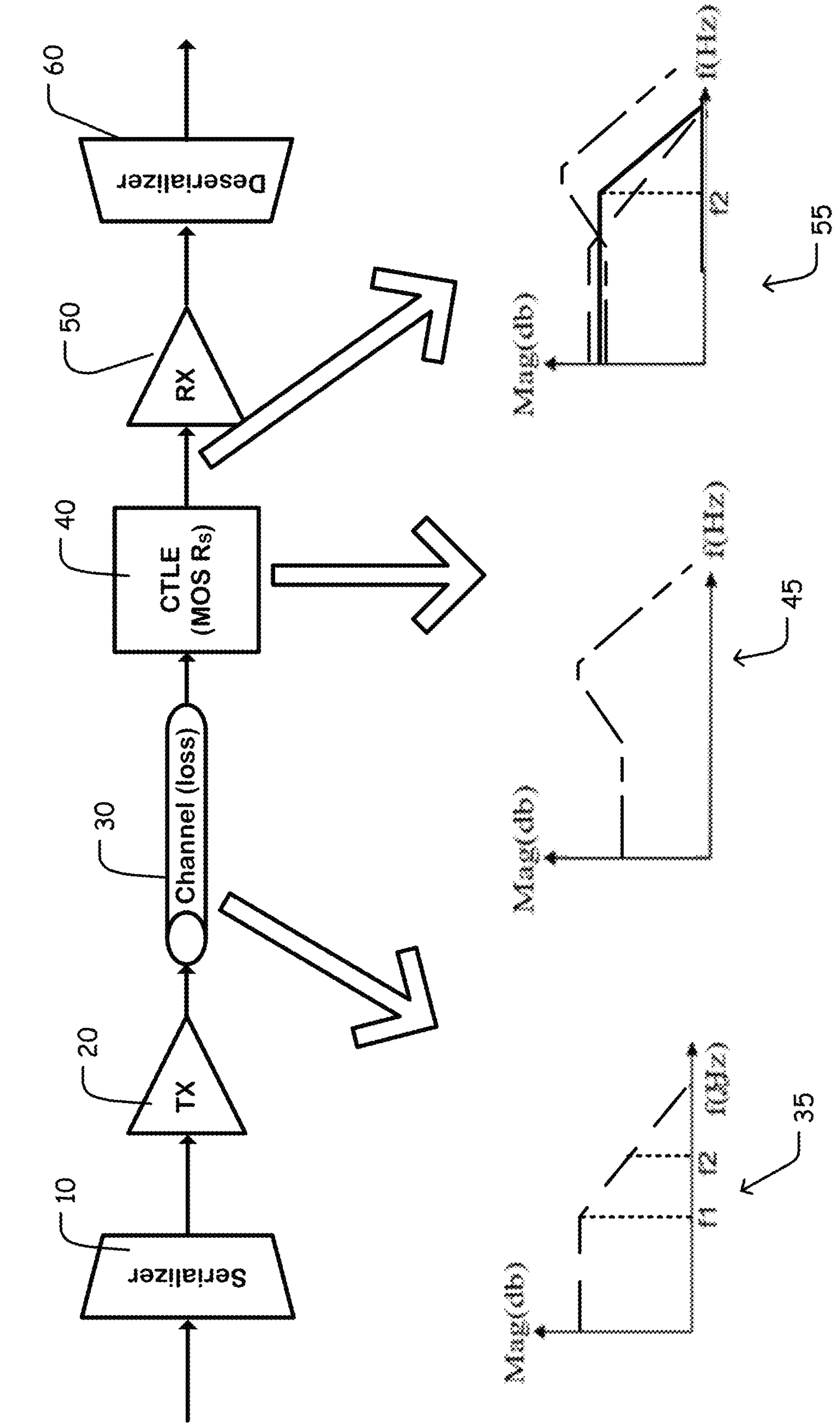
FIG. 1 is a simplified diagram of a communication channel including an equalizer with an input pair having a source-side resistor circuit.

FIG. 1 is a simplified diagram of a communication channel such as can be used in integrated circuit systems. A transmit side of the channel includes serializer 10, the output of which is applied to a transmitter circuit 20. The transmitter circuit 20 applies a signal to a channel circuit 30, which can include a transmission line. The channel circuit 30 is connected to a high-speed input buffer at the destination device. In this example, the high-speed input buffer includes a continuous time linear equalizer CTLE circuit 40, the output of which is applied to a receiver circuit 50. The output of the receiver circuit 50 can be applied to a deserializer 60, delivering input data to the destination device.

The channel circuit 30 can have a low pass filter response, causing channel loss at high frequency as represented by the graph 35 showing signal magnitude in decibels dB versus frequency. Thus, in a target frequency range between $f_1$ and $f_2$, the signal gain can fall in accordance with a low pass filter response of the channel. The equalizer circuit 40 can compensate for low pass filter response of the channel by providing gain in the target frequency range as represented by the graph 45. Characteristics of the signal at the output of the equalizer circuit 40 can be seen in the graph 55, resulting from a combination of the low pass filter characteristic of the channel, with the gain characteristics of the equalizer. The signal can have uniform gain across the target frequency range between frequencies f1 and f2.

In systems as described herein, the equalizer circuit 40 includes an input pair of transistors having a source-side resistor circuit that includes a transistor biased on the triode region (MOS $R_S$). The input pair can be configured as a differential amplifier. The differential amplifier is configured to amplify the difference between two input signals while rejecting the part of the signal common to both inputs. The source-side resistor circuit provides source degeneration. The gain of the transistors in the input pair can track the resistance of the resistor circuit across process corners, sometimes referred to as fast-fast ff, typical-typical tt and slow-slow ss corners.

Figure 2:
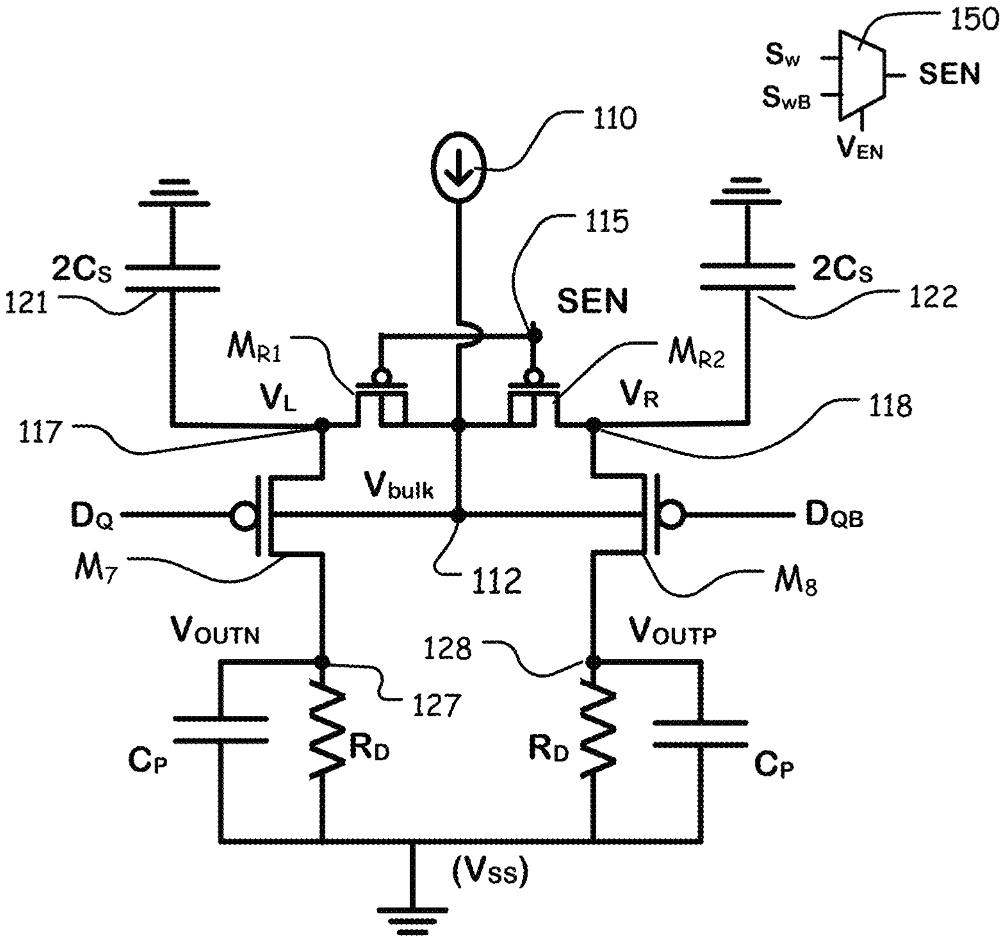
FIG. 2 is a circuit diagram for an example of a differential amplifier having a source-side resistor circuit.

FIG. 2 is a circuit diagram for a differential amplifier including a resistor circuit configured as a source side resistance. The circuit includes an input pair of P-channel transistors $M_7$ and $M_8$ having source terminals at nodes 117 and 118, respectively. Nodes 117 and 118 have voltages $V_L$ and $V_R$, respectively. The resistor circuit includes P-channel transistors $M_{R1}$ and $M_{R2}$. Transistor $M_{R1}$ has a first channel terminal (i.e., source/drain terminal) connected to the node 117 and a second channel terminal connected to the output of the current source 110 at node 112. Transistor $M_{R2}$ has a first channel terminal connected to node 118 and a second channel terminal connected to node 112. Node 112 is connected to the output of the current source 110. Also, the channel bodies, or semiconductor "bulk", of the transistors $M_7$ and $M_8$ of the input pair, and of the transistors $M_{R1}$ and $M_{R2}$ of the resistor circuit, are connected to node 112. The voltage at node 112 is labeled $V_{bulk}$. When transistor $M_{R1}$ is on in a triode region, $V_L$ is equal to $V_{bulk}$–($V_{DS}$ of $M_{R1}$). Also, when transistor $M_{R2}$ is on in a triode region, $V_R$ is equal to $V_{bulk}$–($V_{DS}$ of $M_{R2}$). When operated in the triode region, the drain to source voltage $V_{DS}$ of transistors $M_{R1}$ and $M_{R2}$ varies linearly with $V_L$ and $V_R$ respectively.

The gates of the transistors $M_{R1}$ and $M_{R2}$ of the resistor circuit are connected to a bias voltage SEN. As illustrated in the circuit, the bias voltage SEN can be provided by a switch 150 response to a control signal $V_{EN}$ to provide a first state $S_{wB}$ to enable the differential amplifier and to set transistors $M_{R1}$ and $M_{R2}$ in a triode operating region during operation, and a second state $S_w$ to turn off transistors $M_{R1}$ and $M_{R2}$. An example of a bias circuit to provide the voltages $S_{wB}$ and $S_w$ is described with reference to FIG. 4. The bias circuit can set $S_{wB}$ to a voltage close to the common mode voltage of the input signals, and set $S_w$ to a voltage close to $V_{bulk}$.

A capacitor circuit including at least one capacitor connected to the source of at least one of the transistors $M_7$ and $M_8$ at nodes 117 and 118, and in this example including source capacitor 121 and source capacitor 122 connected to the sources of the transistors $M_7$ and $M_8$. The source capacitor 121 is connected between node 117 and a reference node such as VSS or ground. The source capacitor 122 is connected between node 118 and the reference node. The capacitance ($2C_S$) of the capacitor circuit (source capacitors 121 and 122 in this example) is tuned along with the resistor circuit to set the frequency response of the differential amplifier.

A drain resistor having resistance $R_D$ is connected between the drain of transistor $M_7$ at node 127 and the reference node. Also, a drain resistor having a resistance $R_D$ is connected between the drain of transistor $M_8$ at node 128 and the reference node. In the circuit, parasitic capacitance $C_P$ is illustrated across the drain resistors.

Input voltages $D_Q$ and $D_{QB}$ are applied at the gates of the input pair of transistors $M_7$ and $M_8$.

Output voltages $V_{OUTN}$ and $V_{OUTP}$ of the differential amplifier are generated at nodes 127 and 128, respectively.

A circuit having an input pair with source degeneration, like that illustrated in FIG. 2, can be applied as an amplifier with high voltage gain, such as an operational amplifier, and as an amplifier with high current gain, such as an operational transconductance amplifier. The inputs can be differential signals, or a single ended signal with a reference voltage applied to one of the transistors of the input pair.

It is desirable for the circuit to have a peaking ratio which remains constant across operating temperatures and process corners. The peaking ratio is defined as the ratio between the ideal peak gain and the DC gain of the circuit, and is a function of the effective gain $g_m$ of the input pair and the effective resistance $R_S$ of the source side resistor circuit. For example, the peaking gain can be expressed by the following:

$$\frac{\text{Ideal peak gain}}{\text{DC gain}} = 1 + \frac{g_m R_S}{2} \approx 2$$

In the circuit illustrated, in operation the gate to source voltage of $M_7$ or $M_8$ is about equal to the gate to source voltage of $M_{R1}$ and $M_{R2}$. As a result, $R_S$ varies over temperature and process corners with $g_m$ in a manner that tends to maintain a constant peaking ratio. Accordingly, the input pair of transistors has an effective gain $g_m$, and the resistor circuit has an effective resistance $R_S$, and the effective resistance $R_S$ of the resistor circuit can vary with the $g_m$ over an operating range of temperature and process corners in a way tending to maintain a constant peaking ratio across the operating range in some embodiments.

Figure 3:
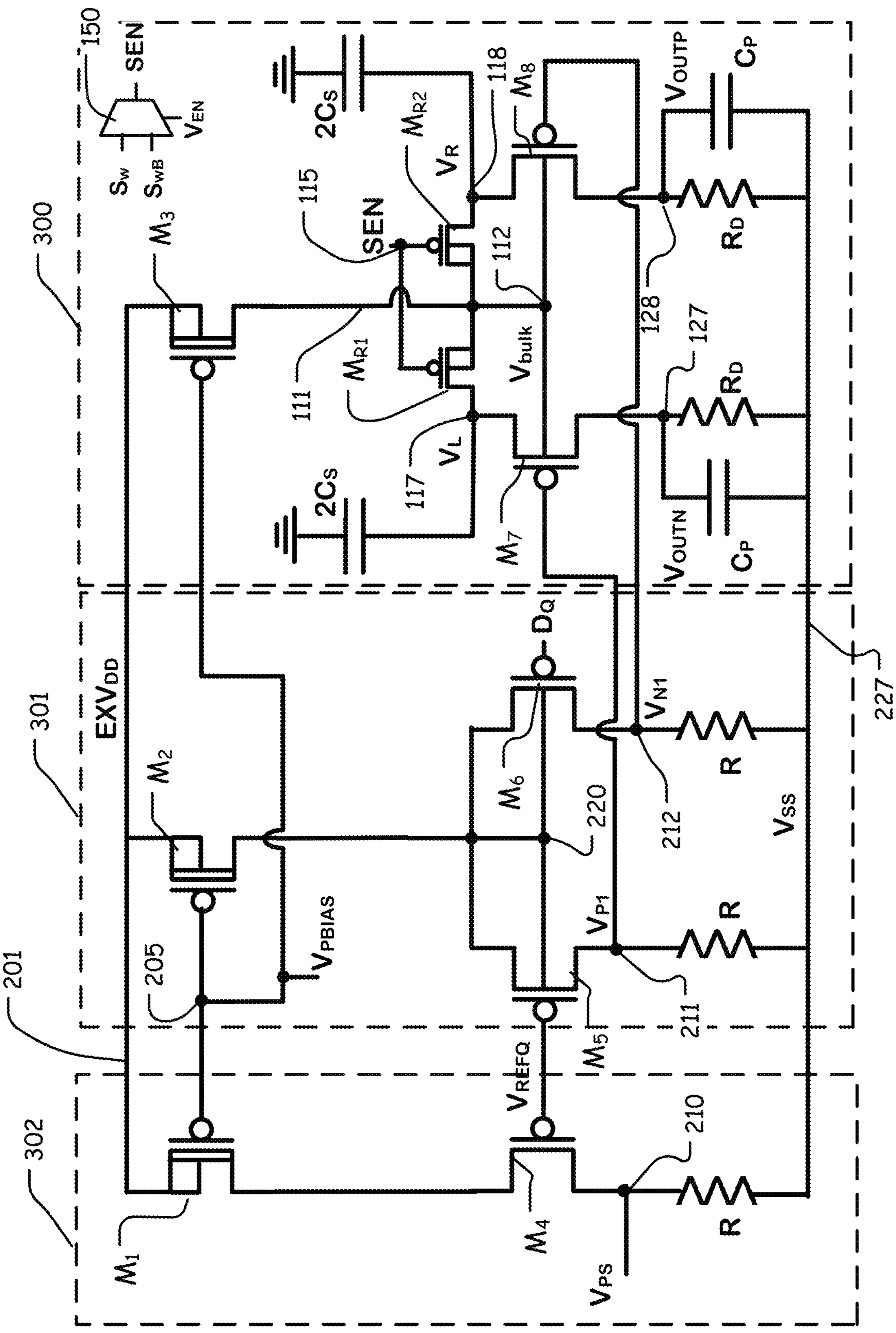
FIG. 3 is a circuit diagram for an example of a continuous time linear equalizer circuit having an input pair configured as a differential amplifier, with a source-side resistor circuit.

FIG. 3 is a circuit diagram for an equalizer circuit including an input pair of transistors with source degeneration using a resistor circuit having a transistor biased in a triode region, like that shown in FIG. 2. The equalizer circuit of FIG. 3 includes the differential amplifier 300, an input circuit 301 to convert a single ended input $D_Q$ to a differential signal $V_{N1}$, $V_{P1}$ to be applied as input to the differential amplifier 300, and a circuit 302 to provide a voltage $V_{PS}$ which tracks the common mode voltage of the output of the input circuit 301. The differential amplifier 300 is like that of FIG. 2 with reference numerals of FIG. 2 applied and not described again. The inputs to the differential pair $M_7$ and $M_8$ are provided by the outputs $V_{P1}$ and $V_{N1}$ of the circuit 301. The current source 110 of FIG. 2 is provided by a P-channel current mirror transistor $M_3$, configured in a current mirror relationship with P-channel transistors $M_1$ and $M_2$ with its gate connected to node 205, and its source connected to node 201, which can be connected to a supply voltage, such as an external supply voltage $EXV_{DD}$. A voltage $V_{PBAIS}$ is applied at node 205. The drain 111 of transistor $M_3$ is connected to node 112, which is the channel bodies or bulk terminal of transistors $M_{R1}$, $M_{R2}$, $M_7$ and $M_8$. Transistors $M_1$, $M_2$ and $M_3$ can be transistors that have small gate-to-source threshold voltage to improve supply voltage headroom.

Circuit 301 includes a pair of P-channel transistors $M_5$ and $M_6$, having source terminals coupled together at node 220. The channel bodies or bulk terminals of transistors $M_5$ and $M_6$ are also connected to node 220. Transistor $M_2$ is connected to provide current at node 220 configured in a current mirror relationship with transistors $M_1$ and $M_3$ with its gate connected to node 205, and its source connected to an external supply voltage $EXV_{DD}$. The drain terminals of transistors $M_5$ and $M_6$ are connected to nodes 211 and 212, respectively. A drain-side resistor having a resistance R is connected between node 211 and reference node 227. Also a drain-side resistor having a resistance R is connected between node 212 and reference node 227. Differential output voltages $V_{P1}$ and $V_{N1}$ are provided at nodes 211 and 212, respectively, which are in turn coupled to the gates of transistors $M_7$ and $M_8$, as mentioned above.

A single ended input signal $D_Q$ is applied to the gate of transistor $M_6$. A reference voltage $V_{REFQ}$ is applied to the gate of transistor $M_5$.

Circuit 302 includes P-channel transistor $M_4$ in series with a current mirror transistor $M_1$, configured in a current mirror relationship with transistors $M_2$ and $M_3$ with its gate connected to node 205, and its source connected to an external supply voltage $EXV_{DD}$. A voltage $V_{PBAIS}$ is applied at node 205 from a bias circuit or other source of a voltage to implement the current mirror. A drain side resistor having resistance R is connected between the drain of transistor $M_4$ at node 210 and the reference node 227. Transistor $M_4$ can have the same dimensions as the differential pair $M_5$ and $M_6$. This circuit produces a node voltage $V_{PS}$ at node 210 which tracks the common mode voltage of the signals $V_{P1}$ and $V_{N1}$ at nodes 211 and 212. The voltage $V_{PS}$ can be used in a bias circuit like that shown in FIG. 4 that generates the control signal $S_{wB}$ used to maintain the resistor circuit transistors in a triode region.

Figure 4:
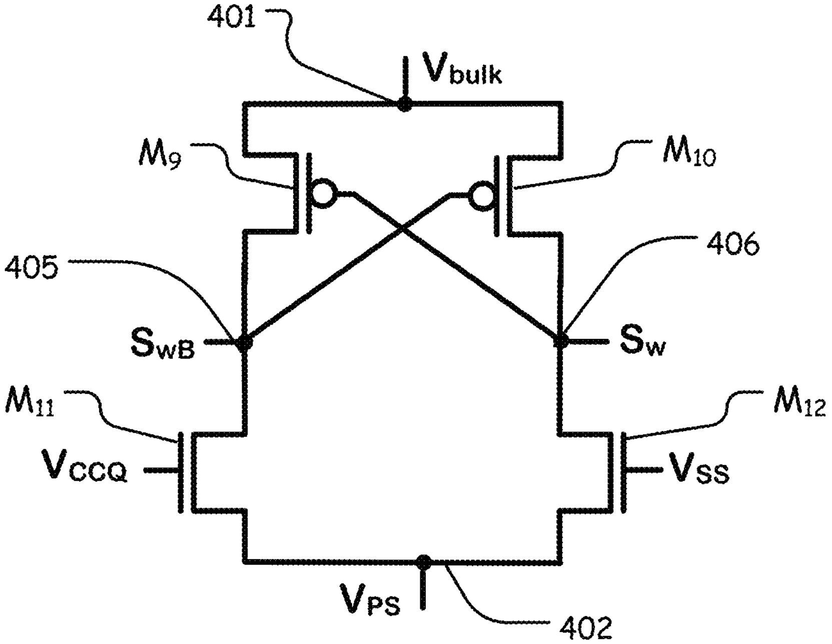
FIG. 4 is a circuit diagram of a bias circuit for the equalizer circuit of FIG. 3.

FIG. 4 is a circuit diagram of a circuit to produce bias voltages for the gates of the first transistor MR1 and the second transistor MR2 in the resistor circuit, including a bias voltage to bias the first transistor MR1 and the second transistor MR2 in a triode region. The circuit is implemented as level shifter in the bias circuit, which can be used to generate the bias voltages $S_w$ and $S_{wB}$. The bias circuit includes a P-channel transistor $M_9$ in series with an N-channel transistor $M_{11}$ between node 401 and node 402. Also, the bias circuit includes a P-channel transistor $M_{10}$ in series with an N-channel transistor $M_{12}$ between node 401 and node 402. Node 401 is connected to the channel body node 112 in the circuit of FIG. 3, or otherwise receives voltage $V_{bulk}$ generated at node 112. Node 402 is connected to node 210 at the drain of transistor $M_4$ in the circuit of FIG. 3, or otherwise receives the node voltage $V_{PS}$. Bias voltage $S_{wB}$ is generated at node 405 between transistors $M_9$ and $M_{11}$. Bias voltage $S_w$ is generated at node 406 between transistors $M_{10}$ and $M_{12}$.

The gates of transistors $M_9$ and $M_{10}$ are connected to nodes 406 and 405, respectively. The gate of transistor $M_{11}$ is connected to a supply voltage $V_{CCQ}$, while the gate of transistor $M_{12}$ is connected to the reference voltage $V_{SS}$. The supply voltage $V_{CCQ}$ can be a regulated supply voltage generated on-chip.

The circuit of FIG. 4 maintains the voltage $S_{wB}$ at node 405. The voltage $S_{wB}$ is equal to, or close to, the common mode voltage $V_{PS}$. The circuit of FIG. 4 maintains the voltage $S_w$ at node 406. The voltage $S_w$ is equal to, or close to, the bulk voltage $V_{bulk}$ at node 112, on the channel body terminal of the transistors in the resistor circuit. A switch connects voltage $S_{wB}$ to node 115 to enable the resistance of the resistor circuit to track gain of the input pair, and connects voltage $S_w$ to node 115 to turn off the resistor circuit.

When $S_{wB}$ is applied to the gates of the transistors $M_{R1}$ and $M_{R2}$ at node 115, $V_L$ is $V_{bulk}-V_{DS}$ of $M_{R1}$ and $V_R$ is $V_{bulk}-V_{DS}$ of $M_{R2}$. However, the $V_{DS}$ values of $M_{R1}$ and $M_{R2}$ are small. So, $V_L$ and $V_R$ will be close to $V_{bulk}$.

In this circuit, when node 115 is set to $S_{wB}$, the gate-to-source voltage $V_{GS}$ of the transistors $M_{R1}$ and $M_{R2}$ in the resistor circuit is $V_{PS}-V_{bulk}$. $V_{PS}$ should be lower than $V_{bulk}$ by an amount to set transistors $M_{R1}$ and $M_{R2}$ in the triode region.

Figure 5:
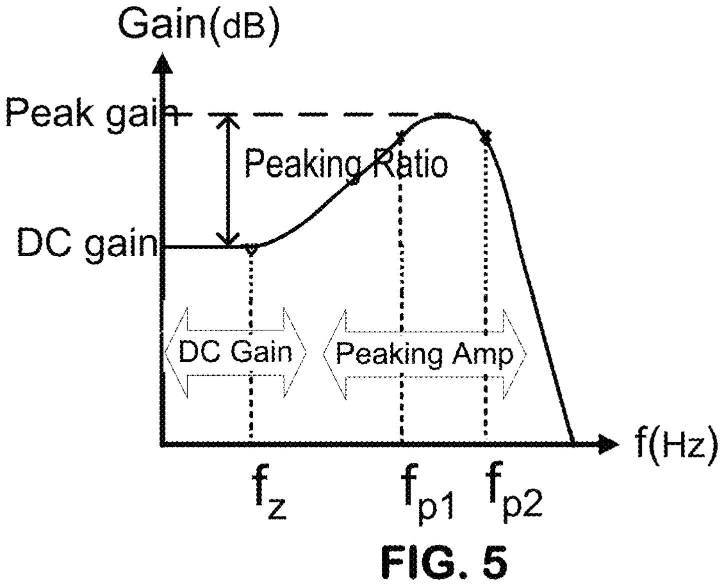
FIG. 5 is a graph illustrating "peaking gain".

FIG. 5 is a graph of gain versus frequency for a circuit like that of FIG. 3. As can be seen, there is essentially constant gain in the lower frequency range, referred to as the DC gain. The gain increases starting at frequency $f_z$ to a target region between $f_{p1}$ and $f_{p2}$, in which a peak gain is achieved. A so-called peaking ratio is a circuit characteristic defined by the ratio of the peak gain to the DC gain. The DC gain and the peak gain of the circuit are functions of the transistor gain $g_m$ of the differential pair of transistors and the source resistance $R_S$ generated by $M_{R1}$ and $M_{R2}$. Using the circuit described herein, the transistor gain $g_m$ and the source resistance $R_S$ can track across process corners.

Using an equalizer circuit as described herein, the peaking ratio can be maintained relatively constant over the target frequency range, across process corners. In a simulation for comparison of a circuit replacing the MOS transistors MR1 and MR2 of FIG. 3 with a physical resistor, to the circuit of FIG. 3, across typical, slow and fast process corners and temperatures ranging from −40 to 105 C, the peaking ratio range of the base circuit was 1.59 to 2.24 (variation of 0.65), while the peaking ratio range of the circuit like that of FIG. 3 was 1.86 to 2.14 (variation of 0.28).

FIG. 6A is a circuit diagram for a differential amplifier including a resistor circuit configured as a source side resistance, like that of FIG. 2 and in which corresponding components have like reference numerals. The resistor circuit includes two pairs of p-channel transistors. The first pair includes $M_{R1}$ and $M_{R2}$. The second pair includes $M_{R3}$ and $M_{R4}$. Transistor $M_{R1}$ has a first channel terminal (i.e., source/drain terminal) connected to the node 117 and a second channel terminal connected to the output of the current source 110 at node 112. Transistor $M_{R2}$ has a first channel terminal connected to node 118 and a second channel terminal connected to node 112. Node 112 is connected to the output of the current source 110. Also, the channel bodies, or semiconductor "bulk", of the transistors $M_7$ and $M_8$ of the input pair, and of the transistors $M_{R1}$ and $M_{R2}$ of the resistor circuit, are connected to node 112. The voltage at node 112 is labeled $V_{bulk}$. When transistor $M_{R1}$ is on in a triode region, $V_L$ is equal to $V_{bulk}-(V_{DS}$ of $M_{R1})$. Also, when transistor $M_{R2}$ is on in a triode region, $V_R$ is equal to $V_{bulk}-(V_{DS}$ of $M_{R2})$. When operated in the triode region, the drain to source voltage $V_{DS}$ of transistors $M_{R1}$ and $M_{R2}$ varies linearly with $V_L$ and $V_R$ respectively.

The gates of the transistors $M_{R1}$ and $M_{R2}$ of the resistor circuit are connected to a first bias voltage SEN1. The bias voltage SEN1 can be provided by a switch 601 response to a first control signal $V_{EN1}$ to provide a first state voltage $S1_{wB}$ to the differential amplifier and to the transistors $M_{R1}$ and $M_{R2}$, biasing them in a triode operating region during operation, and a second state voltage $S1_w$ to transistors $M_{R1}$ and $M_{R2}$, turning them off.

The transistors $M_{R3}$ and $M_{R4}$ can have different sizes than transistors $M_{R1}$ and $M_{R2}$. In this example the transistors $M_{R3}$ and $M_{R4}$ can be larger transistors such that when operated the resistance provided is very low. This can maintain operation of the circuit when tracking is not used.

The gates of the transistors $M_{R3}$ and $M_{R4}$ of the resistor circuit are connected to a second bias voltage SEN2. The second bias voltage SEN2 can be provided by a switch 602 response to a control signal $V_{EN2}$ to provide a first state $S2_{wB}$ to set transistors $M_{R3}$ and $M_{R4}$ in a triode operating region during operation, and a second state S2$w$ to turn off the transistors $M_{R3}$ and $M_{R4}$.

An example of a bias circuit to provide the voltages $S1_{wB}$ and S1$w$ is described with reference to FIG. 6B. The bias circuit can set $S1_{wB}$ to a voltage close to the common mode voltage of the input signals, and set $S1_w$ to a voltage close to $V_{bulk}$. An example of a bias circuit to provide the voltages $S2_{wB}$ and S2$w$ is described with reference to FIG. 6C. The bias circuit can set $S2_{wB}$ to a voltage close to the common mode voltage of the input signals, and set S2$w$ to a voltage close to $V_{bulk}$.

FIGS. 6B and 6C are circuit diagrams of a circuit to bias the first transistor $M_{R1}$ and the second transistor $M_{R2}$ in the resistor circuit, and to bias the third transistor $M_{R3}$ and the fourth transistor $M_{R4}$ in the resistor circuit, respectively. The circuits are implemented as described with reference to FIG. 4 and not described again. These circuits differ in that a first enable signal EN1 is applied to the gate of transistor M11, and its inverse, generated by inverter 603, is applied to the gate of transistor M12, in the circuit of FIG. 6B, and a second enable signal EN2 is applied to the gate of transistor M11, and its inverse, generated by inverter 604, is applied to the gate of transistor M12, in the circuit of FIG. 6C.

Figure 7:
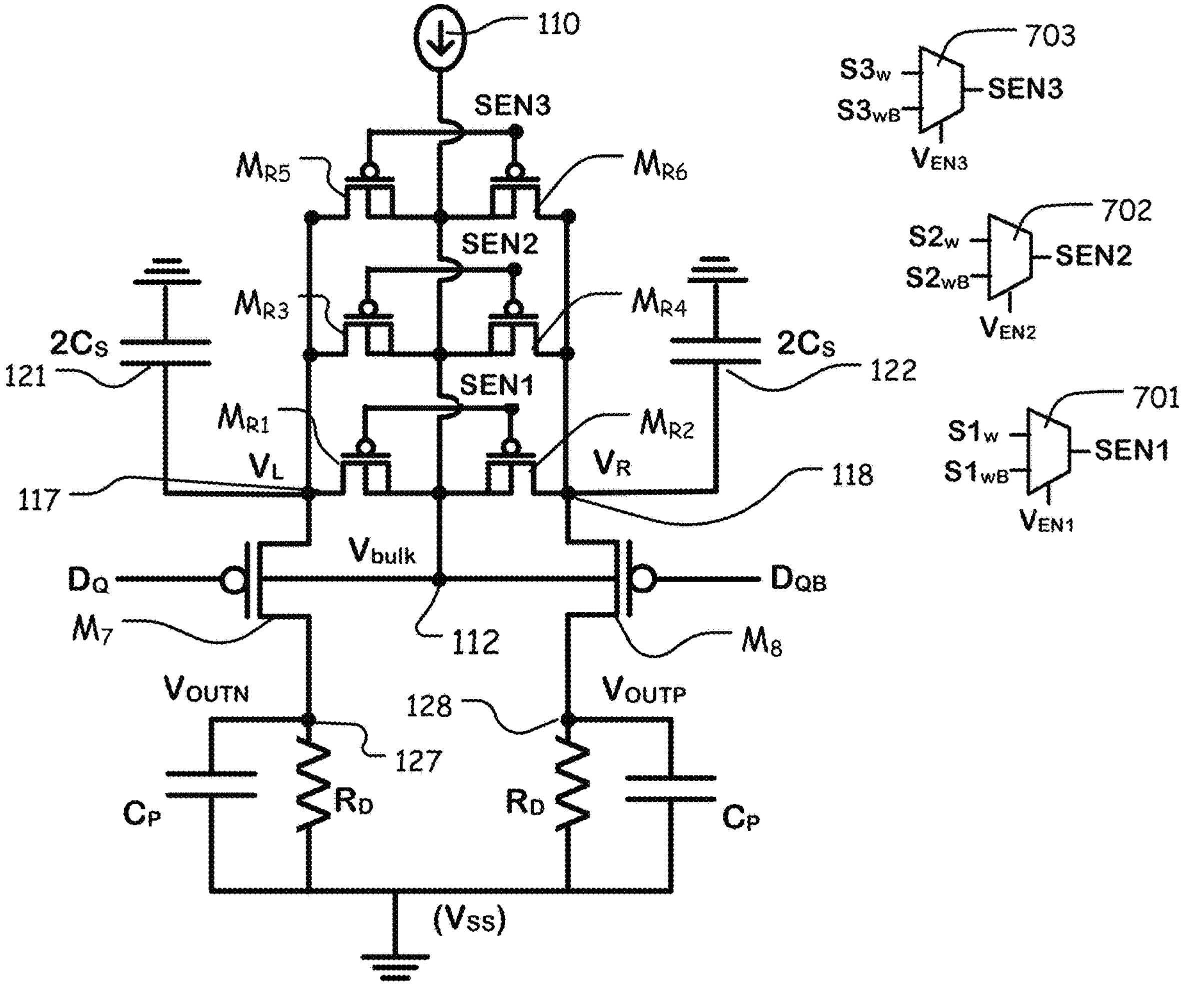
FIG. 7 is a circuit diagram for an example of a differential amplifier having a source-side resistor circuit with three pairs of transistors.

FIG. 7 is yet another example, having in this embodiment three pairs of transistors used in the resistor circuit. The first pair includes $M_{R1}$ and $M_{R2}$. The second pair includes $M_{R3}$ and $M_{R4}$. The third pair includes $M_{R5}$ and $M_{R6}$. Transistor $M_{R1}$ has a first channel terminal (i.e., source/drain terminal) connected to the node 117 and a second channel terminal connected to the output of the current source 110 at node 112. Transistor $M_{R2}$ has a first channel terminal connected to node 118 and a second channel terminal connected to node 112. Node 112 is connected to the output of the current source 110. Also, the channel bodies, or semiconductor "bulk", of the transistors $M_7$ and $M_8$ of the input pair, and of the transistors $M_{R1}$ and $M_{R2}$ of the resistor circuit, are connected to node 112. The voltage at node 112 is labeled $V_{bulk}$. When transistor $M_{R1}$ is on in a triode region, $V_L$ is equal to $V_{bulk}$−($V_{DS}$ of $M_{R1}$). Also, when transistor $M_{R2}$ is on in a triode region, $V_R$ is equal to $V_{bulk}$−($V_{DS}$ of $M_{R2}$). When operated in the triode region, the drain to source voltage $V_{DS}$ of transistors $M_{R1}$ and $M_{R2}$ varies linearly with $V_L$ and $V_R$ respectively.

The gates of the transistors $M_{R1}$ and $M_{R2}$ of the resistor circuit are connected to a first bias voltage SEN1, provided for example by a selector 701 responsive to an enable signal $V_{EN1}$. As illustrated in the circuit, the first bias voltage has a first state $S1_{wB}$ to enable the differential amplifier and to set transistors $M_{R1}$ and $M_{R2}$ in a triode operating region during operation, and a second state S1*w* to turn off the transistors $M_{R1}$ and $M_{R2}$.

The transistors $M_{R3}$ and $M_{R4}$ can have different sizes than transistors $M_{R1}$ and $M_{R2}$, and thereby cause different effects in the circuit. In this example the transistors $M_{R3}$ and $M_{R4}$ can be larger transistors such that when operated the resistance provided is very low. This can maintain operation of the circuit when tracking is not used.

The gates of the transistors $M_{R3}$ and $M_{R4}$ of the resistor circuit are connected to a second bias voltage SEN2, provided for example by a selector 702 responsive to an enable signal $V_{EN2}$. As illustrated in the circuit, the second bias voltage has a first state $S2_{wB}$ to set transistors $M_{R3}$ and $M_{R4}$ in a triode operating region during operation, and a second state S2*w* to turn off the transistors $M_{R3}$ and $M_{R4}$.

The transistors $M_{R5}$ and $M_{R6}$ can have different sizes similar to transistors $M_{R1}$ and $M_{R2}$, and thereby cause slightly different effects in the circuit. In this example the transistors $M_{R5}$ and $M_{R6}$ can be sized in a manner that provides for tuning the tracking characteristic by changing between the first and third pairs.

The gates of the transistors $M_{R5}$ and $M_{R6}$ of the resistor circuit are connected to a third bias voltage SEN3, provided for example by a selector 703 responsive to an enable signal $V_{EN3}$. The selection of the pair of transistors to be operable in the circuit can be accomplished using independent enable signals to the bias circuits, like that described with reference to FIGS. 6B and 6C.

In general, embodiments of the technology can include source side resistor circuits comprising a plurality of pairs of transistors, selected for different effects on the characteristics of the output signals to be produced.

The embodiments described herein are based on amplifiers with an input pair using P-channel transistors (PMOS). In alternative systems, N-channel transistors (NMOS) could be utilized, changing the current mirror transistors and the transistors in the source-side resistor circuit to NMOS transistors. Also, the source resistor, drain resistor and current mirror positions are inverted. P-channel embodiments are preferred in lower voltage systems.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An amplifier circuit, comprising:

an input pair of transistors, the transistors of the input pair of transistors having respective source, drain, gate and bulk terminals;

a resistor circuit connected to the sources of the transistors of the input pair of transistors, the resistor circuit including a first transistor and a second transistor; and a current source connected to provide current through the resistor circuit to the transistors of the input pair of transistors, and wherein the first transistor and the second transistor have gates connected to a bias node, sources connected to the current source, and drains connected to respective sources of the transistors of the input pair of transistors.

2. The amplifier circuit of claim 1, including further comprising:

a bias circuit to bias the first transistor in a triode region.

3. The amplifier circuit of claim 1, wherein the first transistor has source, drain, gate and bulk terminals, and wherein the bulk terminal of the first transistor and the bulk terminals of the transistors of the input pair of transistors are connected together.

4. The amplifier circuit of claim 1, further comprising a bias circuit to bias the first transistor in a triode region and the bias circuit includes a level shifter.

5. The amplifier circuit of claim 4, further comprising a capacitor circuit connected to the source of at least one of the transistors of the input pair of transistors.

6. The amplifier circuit of claim 1, wherein the bulk terminals of the first transistor and the second transistor, and the bulk terminals of the transistors of the input pair of transistors, are connected together.

7. The amplifier circuit of claim 6, including further comprising:

a circuit to bias the first transistor and the second transistor in a triode region.

8. The amplifier circuit of claim 1, further comprising a capacitor circuit connected to the source of at least one of the transistors of the input pair of transistors.

9. The amplifier circuit of claim 1, wherein the input pair of transistors has an effective gain $g_m$, and the resistor circuit has an effective resistance Rs, and the effective resistance Rs of the resistor circuit can vary with the $g_m$ over an operating range of temperature and process corners in a way tending to maintain a constant peaking ratio across the operating range.

10. An amplifier circuit, comprising:

an input pair of transistors including a first transistor and a second transistor, the transistors in the input pair of transistors having respective source, drain, gate and bulk terminals;

a resistor circuit connected to the sources of the transistors in the input pair of transistors, the resistor circuit including:

a first MOS transistor having a first channel terminal connected to the source of the first transistor in the input pair of transistors, and a second channel terminal connected to the bulk terminal of the first transistor in the input pair of transistors; and a second MOS transistor having a first channel terminal connected to the source of the second transistor in the input pair of transistors, and a second channel terminal connected to the bulk terminal of the second transistor in the input pair of transistors;

circuits to bias the first MOS transistor and the second MOS transistor in a triode region; and a current source connected to provide current through the resistor circuit to the input pair of transistors.

11. The amplifier circuit of claim 10, wherein the current source is connected to the bulk terminals of the first and second transistors in the input pair of transistors.

12. The amplifier circuit of claim 10, wherein the resistor circuit includes a plurality of pairs of MOS transistors, the plurality of pair of MOS transistors including a first pair consisting of the first and second transistors, and wherein the resistor circuit includes circuits to selectively apply gate voltages to the plurality of pairs of MOS transistors to enable one pair of MOS transistors of the plurality of pairs of MOS transistors.

13. The amplifier circuit of claim 10, including an input circuit to translate a single ended signal to a differential signal, and to connect the differential signals to the gates of the input pair of transistors.

14. The amplifier circuit of claim 10, wherein the circuits to bias the first MOS transistor and the second MOS transistor include:

a circuit to produce a node voltage to track a common mode voltage of differential input signals applied to the input pair of transistors; and a circuit to produce bias voltages, in response to the node voltage, for the gates of the first and second MOS transistors of the resistor circuit.

15. The amplifier circuit of claim 14, wherein the circuit to produce the node voltage is coupled to the input circuit.

16. The amplifier circuit of claim 14, wherein the circuit to produce bias voltages includes a level shifter.

17. The amplifier circuit of claim 10, including a capacitor circuit connected to the source of at least one of the transistors in the input pair of transistors.

18. The amplifier circuit of claim 10, wherein the input pair of transistors has an effective gain $g_m$, and the resistor circuit has an effective resistance Rs, and the effective resistance Rs of the resistor circuit can vary with the $g_m$ over an operating range of temperature and process corners in a way tending to maintain a constant peaking ratio across the operating range.

19. A method to receive an input signal, the method comprising:

applying the input signal to an equalizer that includes:

an input pair of transistors including a first transistor and a second transistor, the transistors in the input pair of transistors having respective source, drain, gate and bulk terminals, and a resistor circuit connected to the sources of the transistors in the input pair of transistors, the resistor circuit including:

a first MOS transistor having a first channel terminal connected to the source of the first transistor in the input pair of transistors, and a second channel terminal connected to the bulk terminal of the first transistor in the input pair of transistors, and a second MOS transistor having a first channel terminal connected to the source of the second transistor in the input pair of transistors, and a second channel terminal connected to the bulk terminal of the second transistor in the input pair of transistors, and circuits to bias the first MOS transistor and the second MOS transistor in a triode region, and a current source connected to provide current through the resistor circuit to the transistors in the input pair of transistors, and wherein a bulk terminal of at least one of the first MOS transistor and the second MOS transistor in the resistor circuit is connected to the bulk terminal of at least one of the transistors in the input pair of transistors; and biasing at least one of the first MOS transistor and the second MOS transistor in the resistor circuit in a triode region.

20. The method of claim 19, further comprising applying an output of the equalizer to a receiver.

* * * * *